United States Patent
Fürbacher

(10) Patent No.: US 6,462,272 B1
(45) Date of Patent: Oct. 8, 2002

(54) PLANAR RESIST STRUCTURE, IN PARTICULAR AN ENCAPSULATION FOR ELECTRONIC COMPONENT, AND THERMOMECHANICAL PRODUCTION PROCESS

(75) Inventor: Bruno Fürbacher, Ingolstadt (DE)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 09/707,029

(22) Filed: Nov. 6, 2000

Related U.S. Application Data

(63) Continuation of application No. PCT/DE99/01352, filed on May 5, 1999.

(30) Foreign Application Priority Data

May 5, 1998 (DE) .......................................... 198 20 049

(51) Int. Cl.$^7$ ................................................. H01L 23/28
(52) U.S. Cl. ................... 174/52.2; 310/313 R; 361/765
(58) Field of Search .............................. 174/52.2, 52.3, 174/52.4; 310/313 R, 313 C, 313 D; 333/193; 361/719, 722, 760, 761, 762, 765

(56) References Cited

U.S. PATENT DOCUMENTS

| | | | |
|---|---|---|---|
| 5,410,789 A | | 5/1995 | Noto et al. |
| 5,623,236 A | * | 4/1997 | Yoshinaga et al. .......... 333/187 |
| 5,687,462 A | * | 11/1997 | Lazarus et al. ............. 29/25.35 |
| 5,831,369 A | * | 11/1998 | Fürbacher et al. ....... 310/313 R |
| 5,923,231 A | * | 7/1999 | Ohkubo et al. ............. 333/193 |

FOREIGN PATENT DOCUMENTS

| | | | |
|---|---|---|---|
| DE | 19548061 A1 | * | 7/1997 |
| EP | 0330339 A2 | | 8/1989 |

OTHER PUBLICATIONS

Published International application No. 95/30276 (Fuerbacher et al.), dated Nov. 9, 1995.

\* cited by examiner

*Primary Examiner*—Dean A. Reichard
*Assistant Examiner*—Carmelo Oliva
(74) *Attorney, Agent, or Firm*—Laurence A. Greenberg; Werner H. Stemer; Gregory L. Mayback

(57) ABSTRACT

In a thermomechanical process for planarizing a resist layer applied to a partly elevated carrier area, a resist structure, in particular an encapsulation for electronic components, is obtained. In this case, a dry resist sheet, formed of a composite of a temperature-resistant protective sheet and a photosensitive layer, is applied by its photosensitive layer to a surface of the carrier and the dry resist sheet is planarized under pressure and with heat. After which the photosensitive layer is exposed, and the protective sheet is removed and the photosensitive layer is developed.

6 Claims, 4 Drawing Sheets

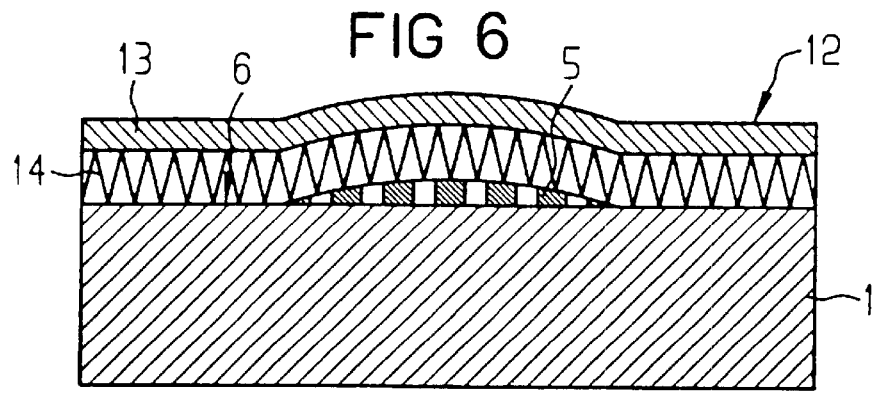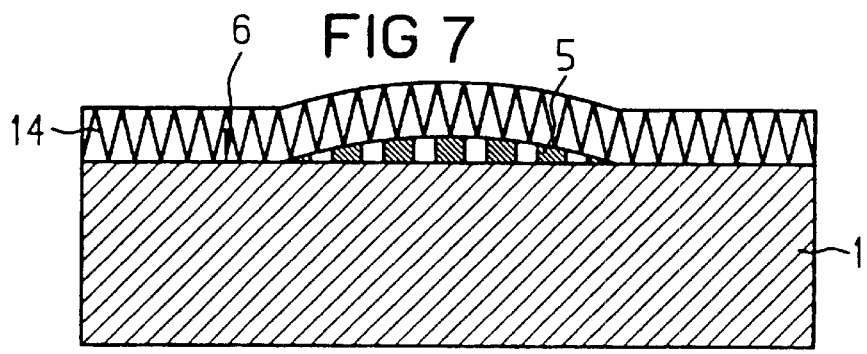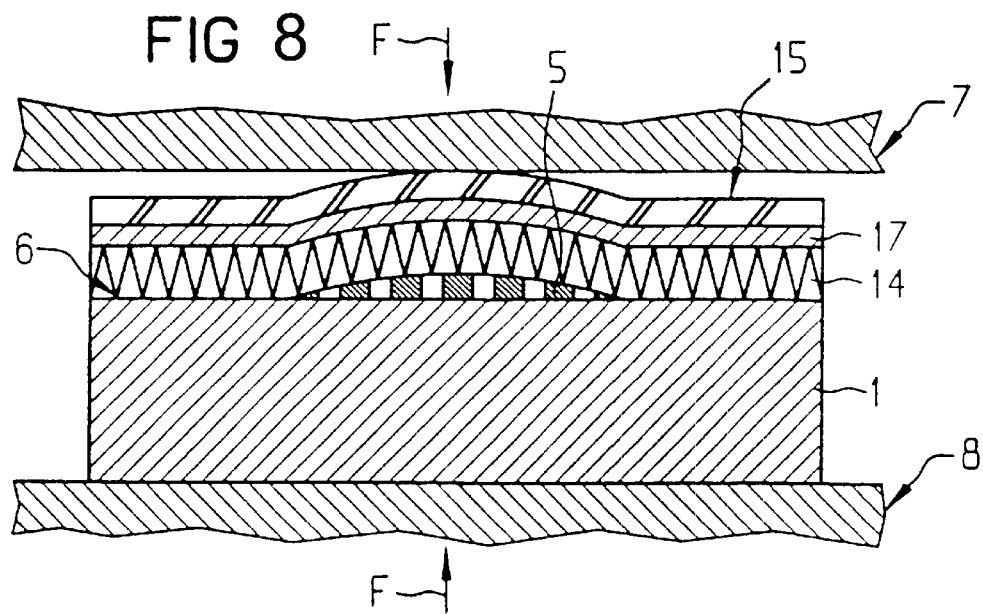

PLANAR RESIST STRUCTURE, IN PARTICULAR AN ENCAPSULATION FOR ELECTRONIC COMPONENT, AND THERMOMECHANICAL PRODUCTION PROCESS

CROSS-REFERENCE TO RELATED APPLICATION

This is a continuation of copending International Application PCT/DE99/01352, filed May 5, 1999, which designated the United States.

BACKGROUND OF THE INVENTION

FIELD OF THE INVENTION

The invention relates to a planar resist structure, in particular an encapsulation for electronic components, and a thermomechanical process for planarizing a photo-patternable layer applied to a partly elevated carrier area.

The Patent Cooperation Treaty (PCT) application with the international publication number WO 95/30276 discloses an encapsulation—which the applicant designates as PROTEC—for electronic components, in particular for components operating with surface acoustic waves—SAW components. The encapsulation has, in regions of the component structures, e.g. in regions of interdigital transducers and of optionally required acoustic attenuation masses that are usually applied using screen printing technology, recesses which accommodate the components. In one of its exemplary embodiments, the above-mentioned PCT application provides for this purpose a frame-like carrier applied to the component substrate, e.g. a piezo-electric substrate, and optionally supports on which a covering layer is disposed. In this case, the carrier, the supports and the covering layer may be formed by a sheet which, on the side of the component substrate, contains depressions spanning the component structures and is applied to the component substrate e.g. by adhesive bonding, welding or lamination.

In accordance with a further known proposal according to the PCT application, a photo-patternable material, i.e. a so-called called dry resist sheet, is used for the carrier and optionally the supports. By way of example, this may be a photoresist or a material which can be patterned by UV light, and which is exposed in such a way that, after it has been developed, only the active components, in particular filter structures, the acoustic attenuation mass and the areas provided for making electrical contact with these component structures are uncovered. A second layer, namely a covering layer, is then applied to the carrier thus produced and—if present—the supports, which layer likewise contains a dry resist sheet, i.e. a photo-patternable material of the above-mentioned type, which is likewise exposed and developed after it has been applied. This material ultimately forms the recesses given sufficient thickness of the first layer containing carrier and optionally supports, together with the layer.

This type of encapsulation—also called PROTEC—which ultimately contains a successive application of two layers of dry resist sheets, the application in each case being correspondingly treated by phototechnology, is unsuitable for all cases in which the dry resist sheets are intended to bear directly on the acoustic attenuation mass.

This is because, in the case of standard lamination, the applied first layer or first dry resist sheet and, consequently, also the second layer or second dry resist sheet follow the uneven contour profile of the acoustic attenuation mass. The uneven application of the second dry resist sheet to the already unevenly bearing first dry resist sheet is unacceptable, however, since under the technically expedient lamination conditions for the second layer, the resulting encapsulations, such as e.g. coverings for chips of SAW components, are not tight.

SUMMARY OF THE INVENTION

It is accordingly an object of the invention to provide a planar resist structure, in particular an encapsulation for electronic components, and a thermomechanical production process, which overcome the above-mentioned disadvantages of the prior art devices and methods of this general type, which ensure reliable application of the second layer or dry resist sheet and thus a hermetically tight encapsulation of chips of electronic components, in particular of SAW components.

With the foregoing and other objects in view there is provided, in accordance with the invention, an electronic component. The electronic component is formed of a substrate, elevated structures disposed on the substrate, and a resist structure having surfaces applied above the elevated structures. The resist structure bears tightly on the substrate and the elevated structures. The resist structure has a varying layer thickness such that the surfaces of the resist structure lie substantially in one plane.

Only the planar resist structure according to the invention enables a further layer to be applied conformally in such a way that a good connection to the resist structure, reliable bearing on the latter and, consequently, a tight encapsulation can be produced.

Assuming that the protective sheet which forms the dry resist sheet in a composite with a photosensitive layer, is a temperature-resistant sheet, i.e. a sheet which cannot be destroyed even at relatively high temperatures, then the solution provided by the process according to the invention is that the dry resist sheet is applied by its photosensitive layer to the surface of the carrier. The dry resist sheet is then treated under pressure and with heat in such a way that the photosensitive layer is planarized. The photosensitive layer is then exposed, and the protective sheet is removed and the photosensitive layer is developed.

If a non-temperature-resistant protective sheet is used, then the invention provides for the protective sheet, after the application of the dry resist sheet, to be drawn off from the photosensitive layer and replaced by a temperature-resistant separating sheet. The temperature-resistant separating sheet has a non-adhering layer on its surface directed toward the photosensitive layer. The separating sheet together with the photosensitive layer is treated under pressure and with heat in such a way that the photosensitive layer is planarized. The separating sheet is then removed and the photosensitive layer is exposed and developed.

The application or the lamination of the dry resist sheet for the first layer is done in accordance with the customary standard processes and leads to a layer free from air bubbles which follows the topography of the attenuation mass applied using screen printing technology, for example. It is only by virtue of the planarization, in which, in the case of a temperature-resistant protective sheet, the dry resist sheet together with the carrier and, in the case of a non-temperature-resistant protective sheet, the carrier coated with the photosensitive layer, together with the separating sheets, are disposed between hot plates and compressed. The viscosity of the photosensitive material of the first layer decreases, on account of the temperature increase, to such an extent that, as a result of the pressure exerted axially on the carrier, the material of this layer flows from the zones situated above the screen printing into the zones without the attenuation mass.

Consequently, the photosensitive layer of the first layer is leveled to such an extent that, after subsequent photo-patterning, the second layer of dry resist sheet can be laminated on in a manner known per se and the resulting encapsulations, e.g. of chips of electronic components, are hermetically tight.

The material is prevented from sticking to the hot plates or pressing apparatus by virtue of the adequate temperature resistance (present in any case) of the protective sheet, e.g. a polyester sheet.

In accordance with an added feature of the invention, a resist layer having a uniform layer thickness is provided that covers the resist structure.

In accordance with an additional feature of the invention, the resist structure forms a frame, and the resist layer forms a cover matching the frame. The frame and the cover together form a cap-shaped covering and enclose a cavity between the substrate, the frame and the cover.

In accordance with another feature of the invention, the resist structure and the resist layer are formed from a dry resist sheet.

In accordance with a further feature of the invention, the elevated structures have metalization layers and/or interconnect structures.

With the foregoing and other objects in view there is further provided, in accordance with the invention, a thermomechanical process for producing a planar resist structure. The process includes the steps of:

a) providing a carrier having a surface and elevations disposed on the surface;

b) applying a dry resist sheet formed of a composite of a temperature-resistant protective sheet and a photosensitive layer to the surface of the carrier such that the photosensitive layer is applied to the surface of the carrier;

c) subjecting the dry resist sheet to pressure and heat resulting in the photosensitive layer being planarized;

e) exposing the photosensitive layer;

f) removing the temperature-resistant protective sheet; and g) developing the photosensitive layer resulting in a developed photosensitive layer.

In accordance with an added feature of the invention, there is the step of providing electronic components as the elevations formed on the carrier.

In accordance with an additional feature of the invention, there are the steps of:

a) applying a photosensitive layer side of a further dry resist sheet, formed of a composite having a protective sheet and the photosensitive layer, to the developed photosensitive layer;

b) exposing the photosensitive layer of the further dry resist sheet;

c) removing the protective sheet of the further dry resist sheet; and d) developing the photosensitive layer of the further dry resist sheet resulting in a further developed photosensitive layer.

In accordance with another feature of the invention, there are the steps of: applying a photosensitive layer side of a further dry resist sheet, formed of a composite of a protective sheet and the photosensitive layer, to the developed photosensitive layer; drawing off the protective sheet of the further dry resist sheet; and exposing and developing the photosensitive layer of the second dry resist sheet resulting in a further developed photosensitive layer.

In accordance with a further feature of the invention, there is the step of curing the developed photosensitive layer and the further developed photosensitive layer.

In accordance with a further added feature of the invention, there are the steps of disposing and compressing the dry resist sheet together with the carrier between hot plates.

In accordance with a further additional feature of the invention, there is the step of using a polyester sheet as the temperature-resistant protective sheet.

With the foregoing and other objects in view there is further provided, in accordance with the invention, a thermomechanical process for producing a planar resist structure. The process includes the steps of:

a) providing a carrier having a surface and elevations disposed on the surface;

b) applying a dry resist sheet formed of a composite of a non-temperature-resistant protective sheet and a photosensitive layer to the surface of the carrier such that the photosensitive layer is applied to the surface of the carrier;

c) separating and removing the non-temperature-resistant protective sheet from the photosensitive layer;

d) applying a temperature-resistant separating sheet having a non-adhering layer on the photosensitive layer such that the non-adhering layer resides on the photosensitive layer;

e) subjecting the temperature-resistant separating sheet together with the photosensitive layer to pressure and heat such that the photosensitive layer is planarized;

f) removing the temperature-resistant separating sheet;

g) exposing the photosensitive layer; and h) developing the photosensitive layer.

In accordance with an added feature of the invention, there are the steps of disposing and compressing the carrier coated with the photosensitive layer together with the temperature-resistant separating sheet, between hot plates.

In accordance with another feature of the invention, there is the step of using a polyolefin sheet as the non-temperatureresistant protective sheet.

In accordance with an additional feature of the invention, there is the step of forming the non-adhering layer of the temperature-resistance separating sheet from silicone.

In accordance with a concomitant feature of the invention, there is the step of forming the non-adhering layer of the temperature-resistance separating sheet from polytetrafluoroethylene (PTFE).

Other features which are considered as characteristic for the invention are set forth in the appended claims.

Although the invention is illustrated and described herein as embodied in a planar resist structure, in particular an encapsulation for electronic components, and a thermomechanical production process, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 6 to 9 are sectional views of essential method steps for producing a second exemplary embodiment.

DESCRIPTION OF THE PREFERRED EMBODIMENTS

Figure 1:
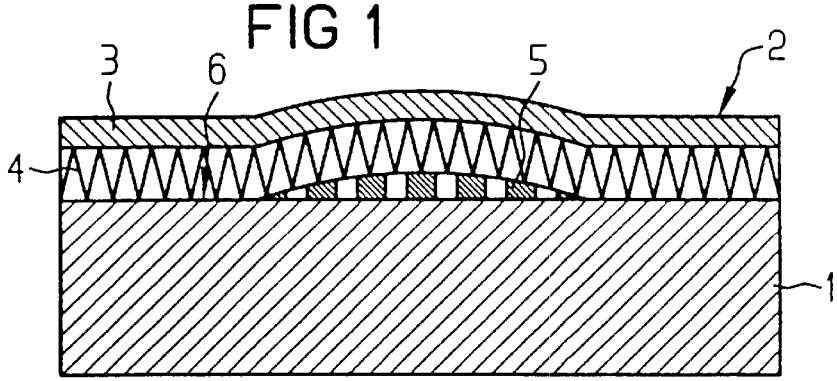
FIGS. 1 to 5 are diagrammatic, sectional views, showing essential method steps for producing a first exemplary embodiment of the subject matter according to the invention.

In all the figures of the drawing, sub-features and integral parts that correspond to one another bear the same reference symbol in each case. Referring now to the figures of the drawing in detail and first, particularly, to FIGS. 1–3 thereof, there is shown the production of a first exemplary embodiment of a surface acoustic wave (SAW) component. The SAW component is formed from a dry resist sheet 2 laminated in a customary manner onto one surface 6 of a carrier 1 made of a piezo-electric material. In the case of customary mass production, the carrier 1 is a wafer, which has, in regions of its individual SAW components, acoustic attenuation masses 5 in each case applied using screen printing technology, for example. The dry resist sheet 2 is formed of a composite of a temperature-resistant protective sheet 3, e.g. a polyester sheet, and a photosensitive layer 4.

Figure 2:
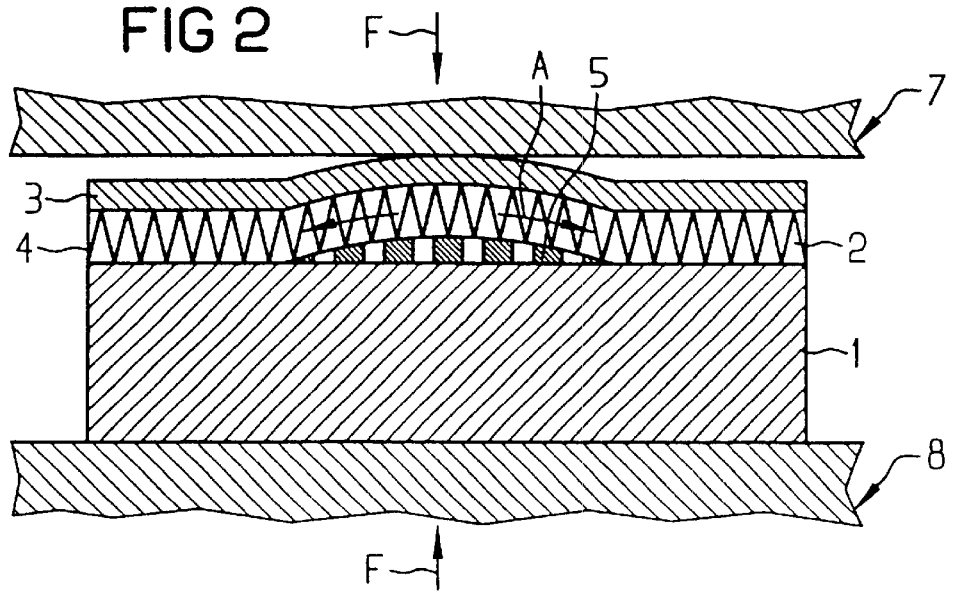
Figure 3:
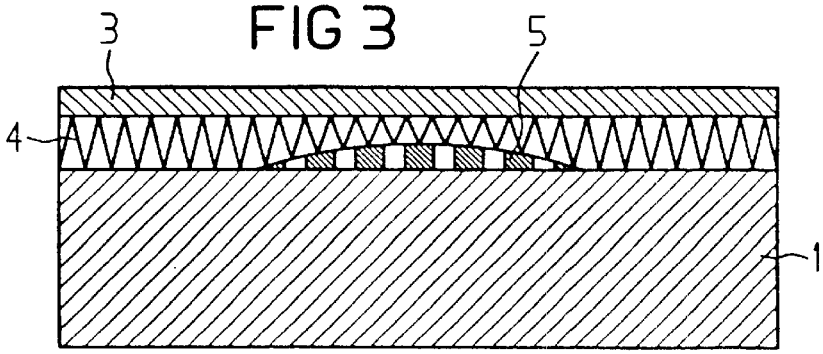

In a further step—see FIG. 2—the wafer thus coated is disposed between heating plates 7, 8 of a pressure apparatus and the dry resist sheet 2 is planarized—see FIG. 3—under pressure—see arrows F. Due to the heat, the photosensitive material 4, as viewed in arrow direction A (FIG. 2), partly flows into the zones that are free of the attenuation masses 5.

Figure 4:
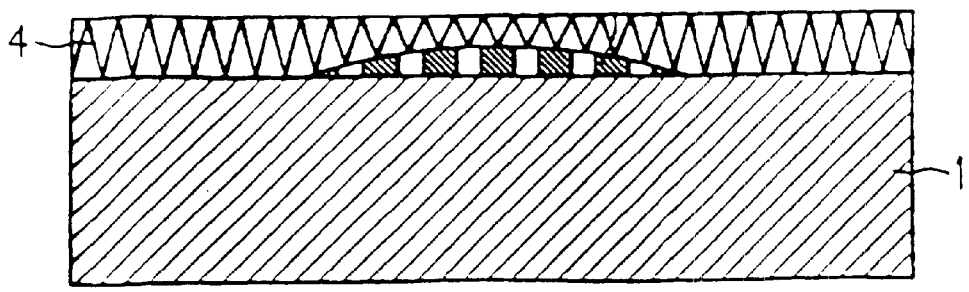

Afterwards, the photosensitive layer 4 is exposed, the protective sheet 3 is drawn off and the exposed photosensitive layer 4 is developed, thereby concluding the production process for the first PROTEC layer, see FIG. 4.

Figure 5:
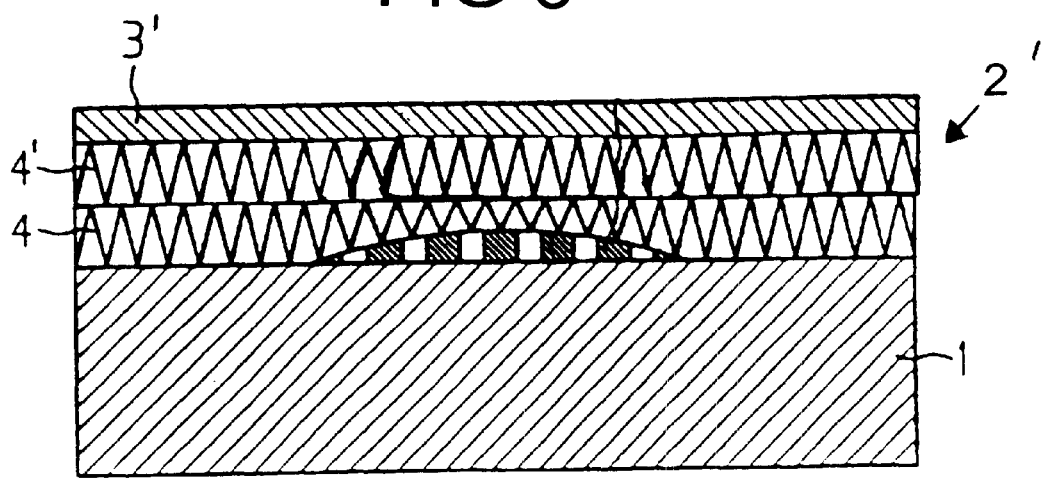
Figure 9:
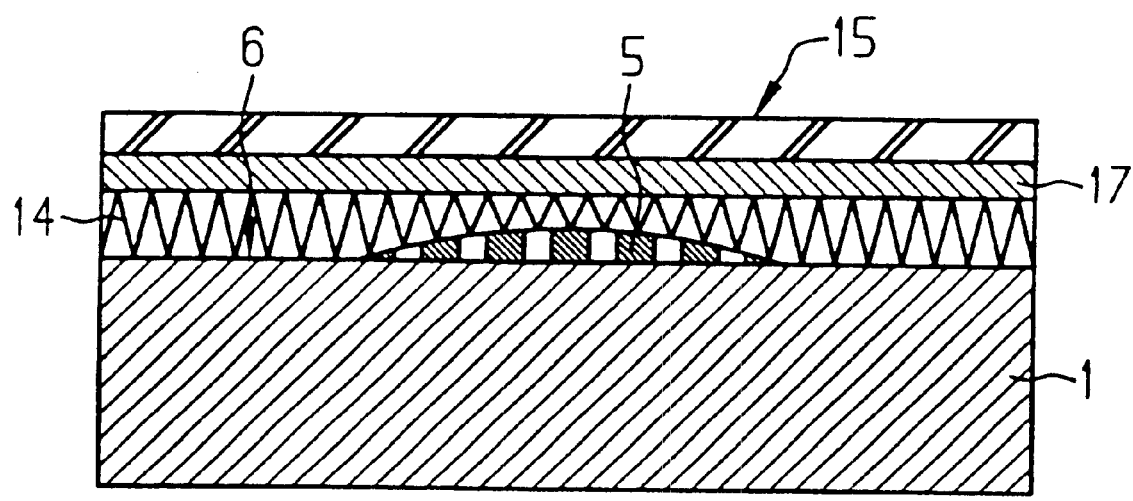

The starting product that is used for producing the second PROTEC layer, required for creating the complete encapsulation, is once again a dry resist sheet 2' of the constitution mentioned above, which is applied by its photosensitive layer 4' to the developed planar layer 4 in a manner known per se, see FIG. 5. After which the photosensitive layer 4' is exposed, a protective sheet 3' is removed and the exposed photosensitive layer 4' is developed.

Alternatively, instead of the above-mentioned dry resist sheet 2' for the second PROTEC layer with the temperature-resistant protective sheet 4', it is possible to apply to the developed layer 4 a dry resist sheet which has a non-temperature-resistant protective sheet, e.g. polyolefin sheet. In this case, with insufficient transmission for the wavelengths used, the photosensitive layer can only be exposed after the protective sheet has been removed.

For the final encapsulation, after the application and development of the second photosensitive layer, the developed layers are cured e.g. by UV radiation and/or thermally.

In the method in accordance with the exemplary embodiment according to FIGS. 6 to 9, use is made of a dry resist sheet 12 for the first PROTEC layer which contains a composite of a non-temperature-resistant protective sheet 13, e.g. a polyolefin sheet, with a photosensitive layer 14—see FIG. 6. On account of its insufficient heat resistance, the protective sheet must be removed before the planarization (already explained)—see FIG. 7—and replaced by a temperature-resistant separating sheet 15, e.g. a polyester sheet. On its surface directed toward the carrier 1, the separating sheet 15 has e.g. a silicone layer or a polytetrafluoroethylene layer (PTFE layer) 17, which, during the subsequent planarization, see FIGS. 8–9, prevents the photosensitive layer 14 from sticking to the heating plate 7 and enables the later removal of the separating sheet 15 from the photosensitive layer 14.

After planarization has been carried out, then—as has already been described with reference to the first exemplary embodiments—the separating sheet 15 is removed and then the photosensitive layer 14 is exposed and developed, thereby creating the first PROTEC layer of the encapsulation.

Depending on the sheet used, the second PROTEC layer is once again produced in one of the ways that have already been described for the first exemplary embodiment, which results in that it is not necessary to explain these production steps again.

I claim:

1. An electronic component, comprising:

a carrier;

acoustic attenuation masses disposed on said carrier; and a structured dry resist sheet having surfaces applied above said acoustic attenuation masses, said dry resist sheet bearing tightly on said carrier and said acoustic attenuation masses, and said dry resist sheet having a varying layer thickness such that said surfaces of said dry resist sheet lie substantially in one plane.

2. The component according to claim 1, including a protective sheet having a uniform layer thickness covering said dry resist sheet.

3. The component according to claim 2, wherein said dry resist sheet forms a frame, said protective sheet forms a cap matching said frame, said frame and said cap together form a cap-shaped covering and enclose a cavity between said carrier, said frame and said cap.

4. The component according to claim 2, wherein said protective sheet is formed from a dry resist foil.

5. The component according to claim 1, wherein said acoustic attenuation masses have metalization layers.

6. The component according to claim 1, wherein said acoustic attenuation masses have interconnect structures.

* * * * *